(12) United States Patent
Park

(10) Patent No.: US 6,797,590 B2
(45) Date of Patent: Sep. 28, 2004

(54) DRAM CELL STRUCTURE CAPABLE OF HIGH INTEGRATION AND FABRICATION METHOD THEREOF

(75) Inventor: Cheolsoo Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/427,974

(22) Filed: May 2, 2003

(65) Prior Publication Data

US 2003/0205748 A1 Nov. 6, 2003

(30) Foreign Application Priority Data

May 2, 2002 (KR) .............................. 10-2002-0024051

(51) Int. Cl.[7] ............................................ H01L 27/108
(52) U.S. Cl. .................... 438/FOR 430; 438/FOR 438; 438/381; 438/689
(58) Field of Search ................................. 438/FOR 430, 438/FOR 438, 689, 381; 257/296–310

(56) References Cited

U.S. PATENT DOCUMENTS 5,291,438 A * 3/1994 Witek et al. ................. 365/149
6,496,401 B2 * 12/2002 Weis ............................ 365/51

* cited by examiner

Primary Examiner—Fetsum Abraham
(74) Attorney, Agent, or Firm—Jacobson Holman PLLC

(57) ABSTRACT

A DRAM cell structure capable of high integration includes a trench-type capacitor formed in a lower region of a trench, the trench being made vertically and cylindrically in a silicon substrate, and a transistor being formed vertically and cylindrically over the trench-type capacitor, the transistor being connected to the capacitor. A method for fabricating a DRAM cell structure capable of high integration includes the steps of (a) forming a trench vertically and cylindrically in a silicon substrate, (b) forming a trench-type capacitor having a cylindrical plate electrode and a storage node electrode on a lower region of the trench, (c) forming a vertical cylindrical transistor cell structure connected to the trench-type capacitor on an upper region of the trench.

25 Claims, 15 Drawing Sheets

DRAM CELL STRUCTURE CAPABLE OF HIGH INTEGRATION AND FABRICATION METHOD THEREOF

FIELD OF THE INVENTION

The present invention relates to a DRAM cell structure capable of high integration and a fabrication method thereof; and, more particularly, to a vertical cylindrical DRAM cell structure capable of high integration connected to a trench-type capacitor and a fabrication method thereof.

BACKGROUND OF THE INVENTION

A DRAM is a device formed by combination of many memory cells composed of a transistor and a capacitor. Recently, DRAMs are being integrated in higher density in response to demands for larger memory capacity. Therefore, techniques for reducing a memory cell size to integrate more memory cells in a confined space have been required.

FIG. 1 illustrates a conventional DRAM cell structure. As shown in FIG. 1, a conventional DRAM cell structure includes a transistor device formed horizontally on a silicon substrate, and a capacitor device having a plate electrode and a storage node electrode formed on a stacked layer over the transistor device.

However, the conventional horizontal DRAM cell structure shown in FIG. 1 has drawbacks. First, integration density is limited due to word-line size and length. Second, it is difficult to secure a large enough size of the capacitor for sufficient capacitance.

SUMMARY OF THE INVENTION

It is, therefore, an object of the present invention to provide a vertical cylindrical DRAM cell structure connected to a trench-type capacitor capable of high integration and a fabrication method thereof.

In accordance with one aspect of the present invention, there is provided a DRAM cell structure capable of high integration, including: a trench-type capacitor formed in a lower region of a trench, the trench being made vertically and cylindrically in a silicon substrate; a transistor formed vertically and cylindrically over the trench-type capacitor, the transistor being connected to the capacitor.

In accordance with another aspect of the present invention, there is provided a method for fabricating a DRAM cell structure capable of high integration, including the steps of (a) forming a trench vertically and cylindrically in a silicon substrate; (b) forming a trench-type capacitor having a cylindrical plate electrode and a storage node electrode on a lower region of the trench; (c) forming a vertical cylindrical transistor cell structure connected to the trench-type capacitor on an upper region of the trench.

BRIEF DESCRIPTION OF THE DRAWINGS

The above and other objects and features of the present invention will become apparent from the following description of preferred embodiments given in conjunction with the accompanying drawings, in which:

FIGS. 3A–3M explain a method for fabricating a vertical cylindrical DRAM cell in accordance with a preferred embodiment of the present invention.

DETAILED DESCRIPTION OF PREFERRED EMBODIMENTS

Hereinafter, a preferred embodiment of the present invention will be described in detail with reference to the accompanying drawings.

Figure 1:
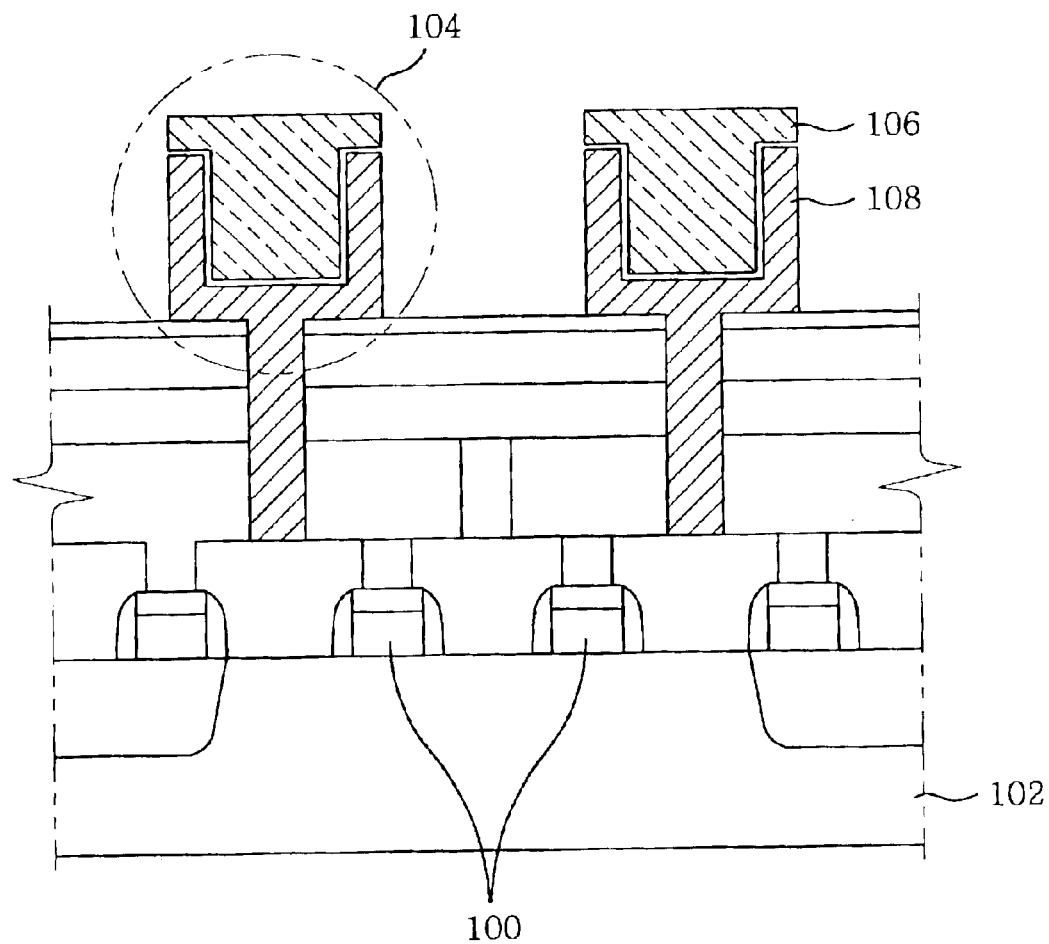
FIG. 1 illustrates a conventional DRAM cell structure.
Figure 2:
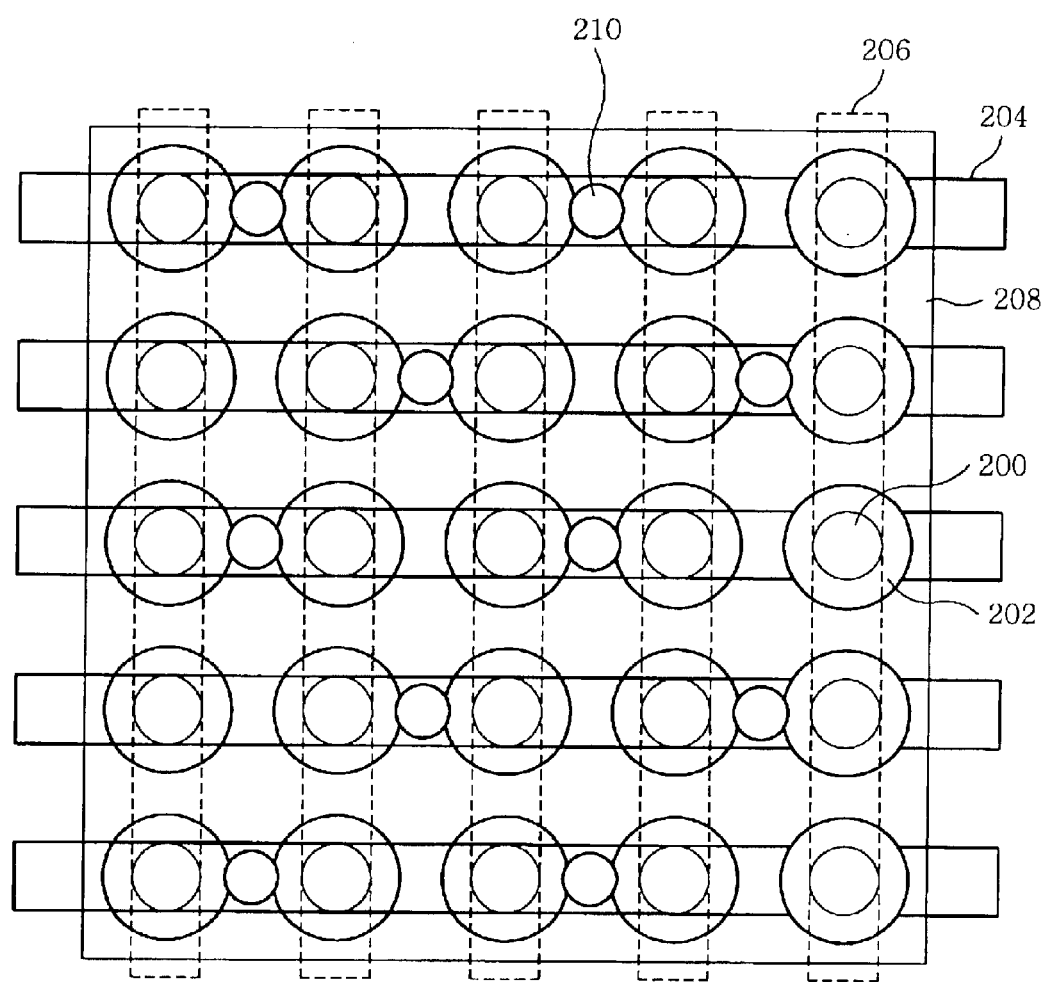
FIG. 2 depicts a silicon substrate on which a vertical cylindrical trench is formed in accordance with a preferred embodiment of the present invention.

FIG. 2 illustrates a layout for fabricating a vertical cylindrical DRAM cell having a trench-type capacitor in accordance with a preferred embodiment of the present invention. First, a vertical cylindrical trench is formed on a silicon substrate 208 by using a trench mask 200 and an isolation mask 202 patterned in circular form. Next, employing a damascene method, a word-line contact is formed by using a word-line mask 206 and a bit-line mask 204. And next, a bit-line contact plug is formed by using a bit-line contact mask 210. Bit-line electrode material is deposited on the bit-line contact plug, and then a bit-line is formed by using a bit-line formation mask 204.

FIGS. 3A–3M illustrate a method for fabricating a DRAM cell connected to a trench-type capacitor and formed vertically and cylindrically on a silicon substrate to thereby increase an integration density in accordance with a preferred embodiment of the present invention. Hereinafter, a transistor device is assumed to be n-type, but the same principle can be applied for p-type case as well.

Figure 3A:
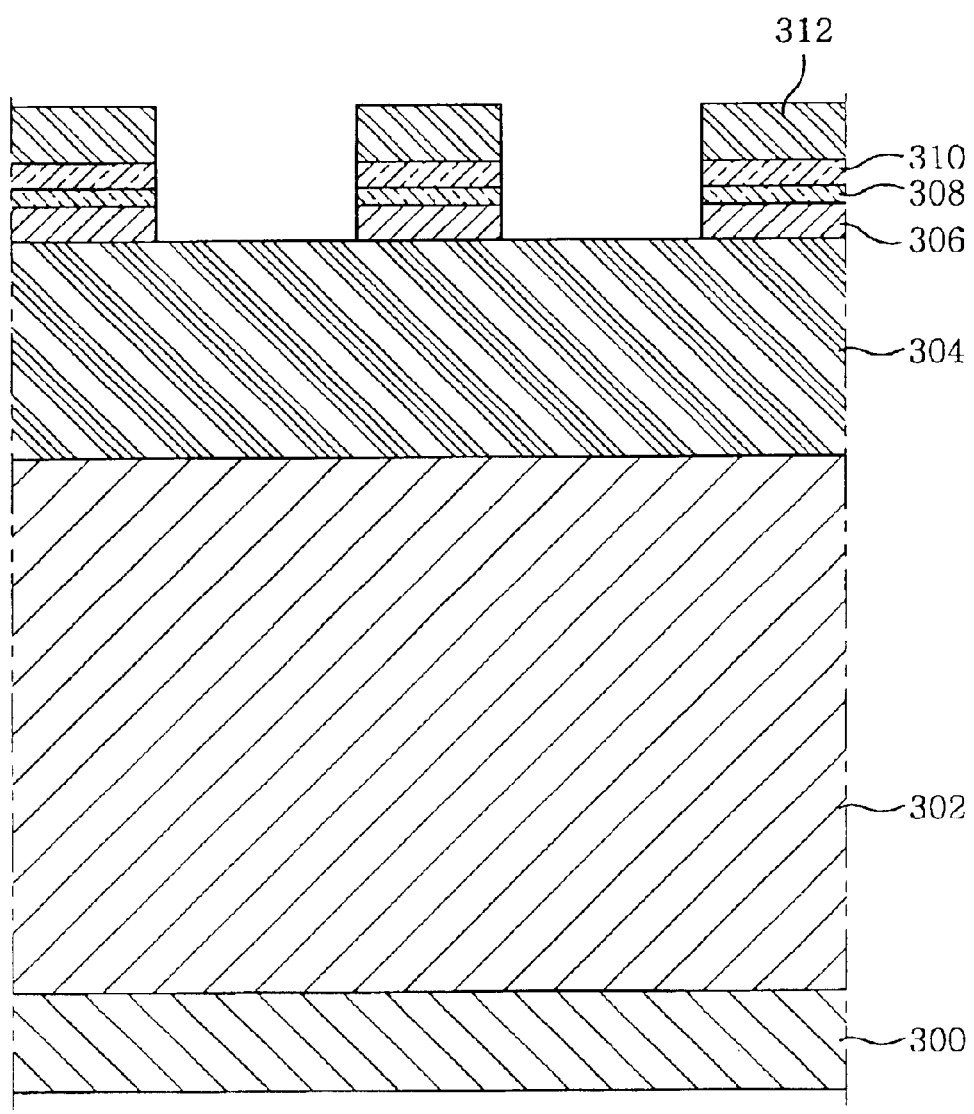

In order to form a trench for fabricating a vertical cylindrical DRAM cell in a silicon substrate as shown in FIG. 2, a buried n-well 302 is formed on a silicon substrate 300, and then a p-well 304 is formed on the buried n-well 302 as illustrated in FIG. 3A. Next, a first oxide film 306, a first nitride film 308 and a second oxide film 310 are sequentially deposited, and then a photoresist layer for a trench mask patterning is deposited on the second oxide layer 310. Next, through a photolithography process and an etching process, a trench mask 312 is formed by patterning the photoresist on a portion to be etched for making a trench. Then, the second oxide film 310, the first nitride film 308 and the first oxide film 306 are sequentially etched by using the patterned trench mask 312.

Figure 3B:
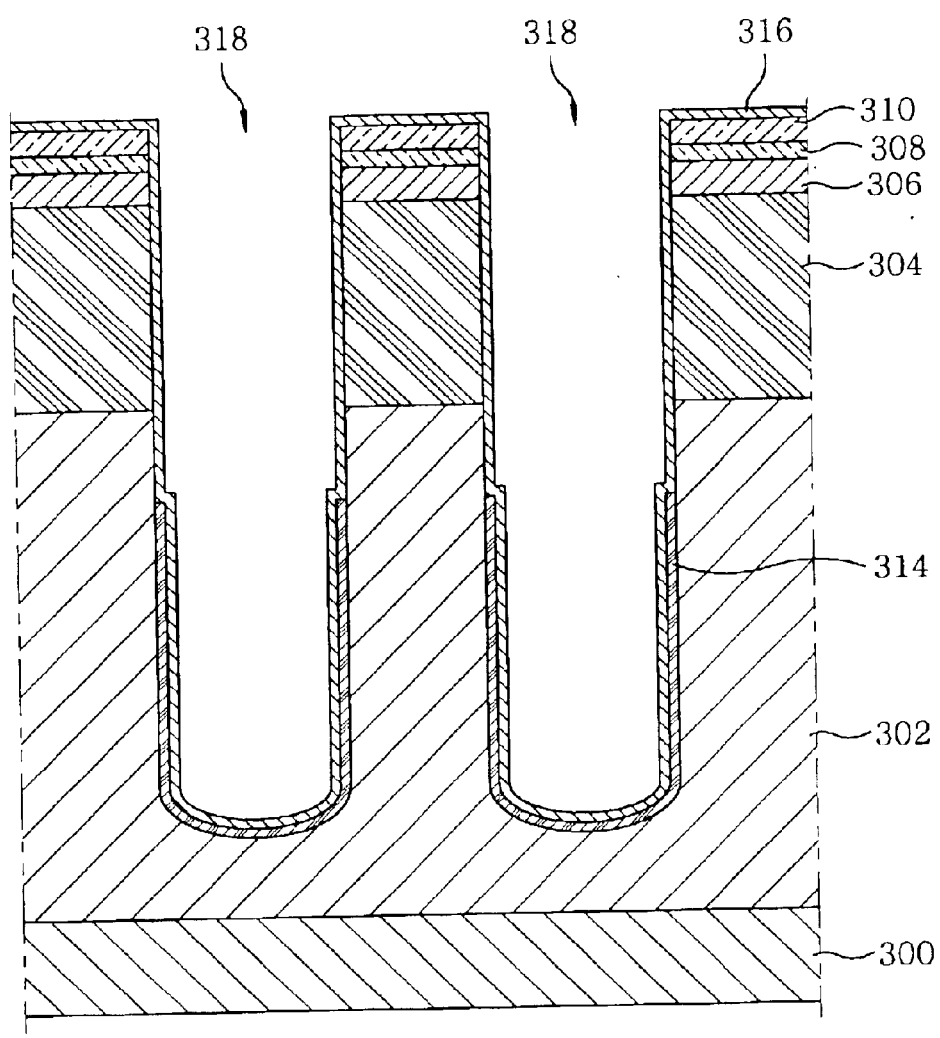

As illustrated in FIG. 3B, the trench mask 312 is then removed, and a cylindrical trench 318 for fabricating a vertical cylindrical DRAM cell is formed by etching a silicon substrate at the portion for making a trench, wherein the second oxide layer 310 is used as an etching mask. The trench etching is performed by using a high dry etching selection ratio of oxide and silicon to a depth of about several micrometers or more. Next, an LPTEOS layer 314 doped with n-type impurity, e.g., phosphorous, is deposited and coated with photoresist, and then etched back down to the p-well region 304. Next, the photoresist is removed, the exposed LPTEOS is removed by dry etching, and then a third oxide layer 316 is deposited.

Figure 3C:
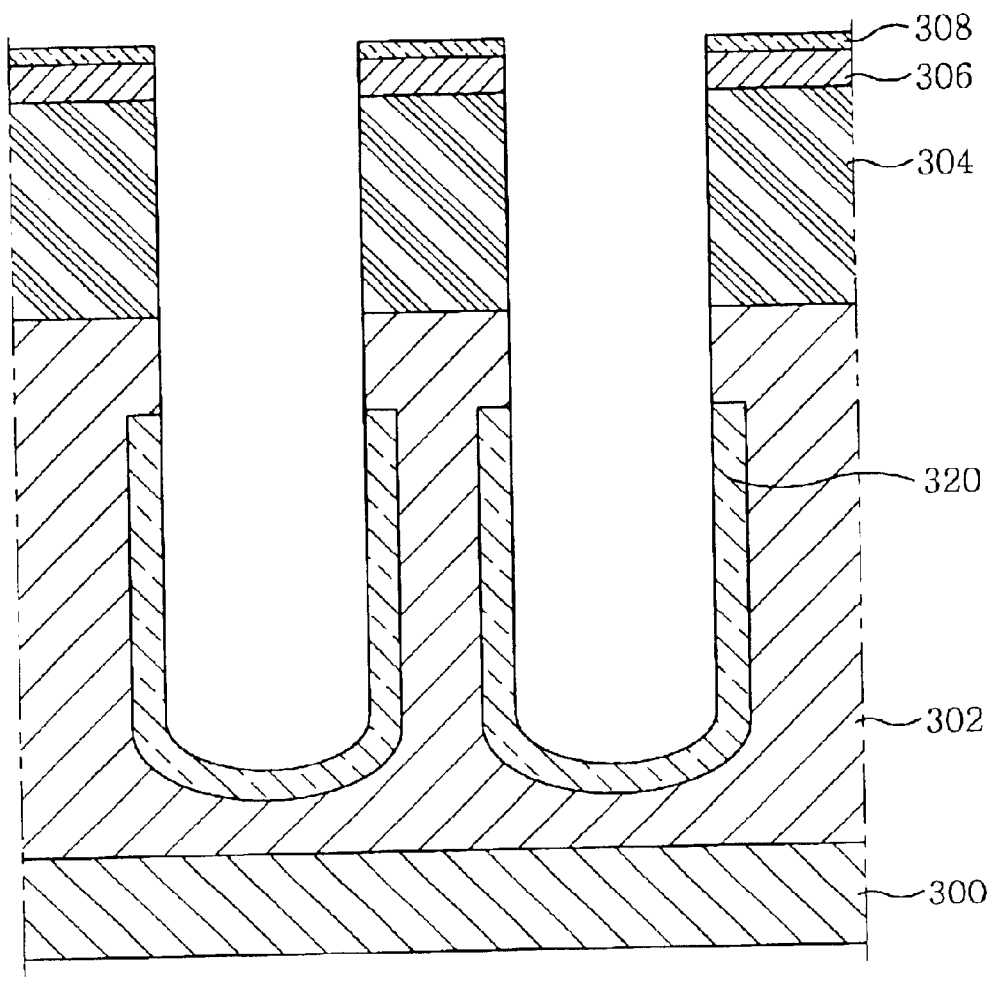

As illustrated in FIG. 3C, a plate electrode 320 is then formed in the buried n-well region 302 by doping the LPTEOS layer 314 with phosphorous and diffusing the phosphorous into the silicon substrate through an annealing process. Next, the p-doped LPTEOS layer 314 and the third oxide layer 316 are removed by wet etching.

Figure 3D:
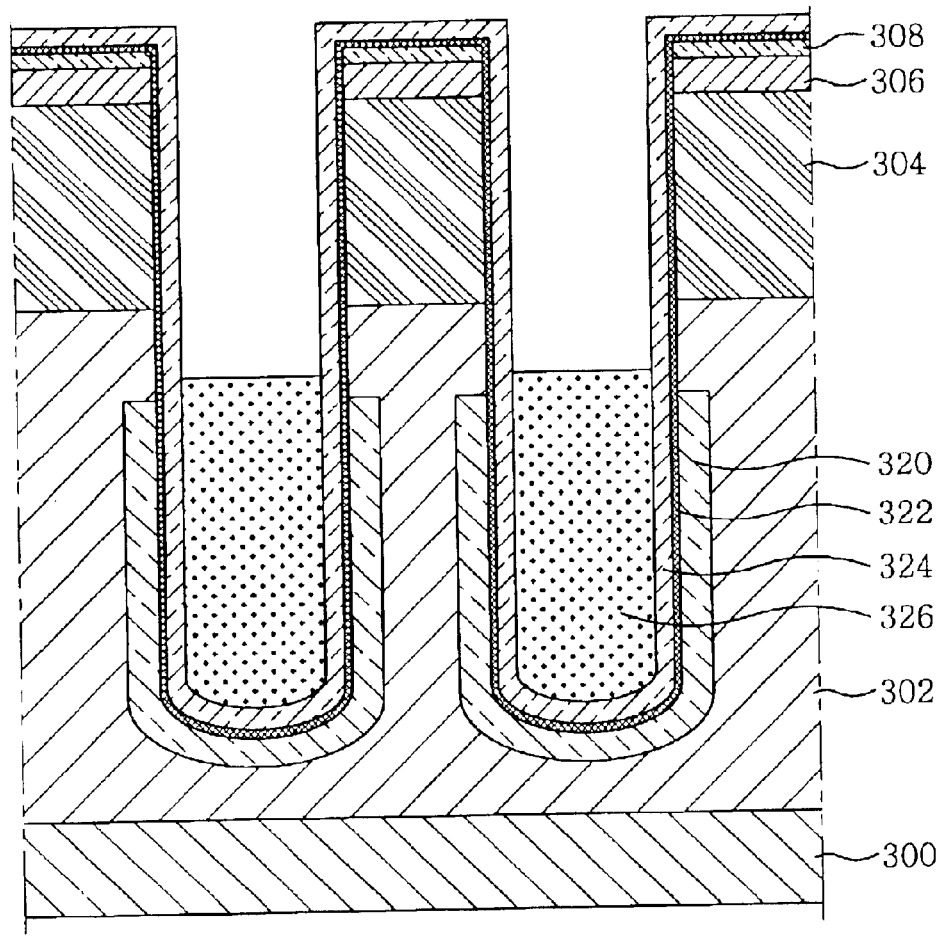

Referring to FIG. 3D, a storage capacitor insulation film 322 and a storage node 324 formed by doping polysilicon are sequentially deposited on a surface of the silicon substrate of FIG. 3C. A fourth oxide layer 326 is then stacked in the capacitor-formed trench to thereby fill the trench. Next, the fourth oxide layer 326 is etched back up to the plate electrode 320 by using a high selection ratio of oxide and poly.

Figure 3E:
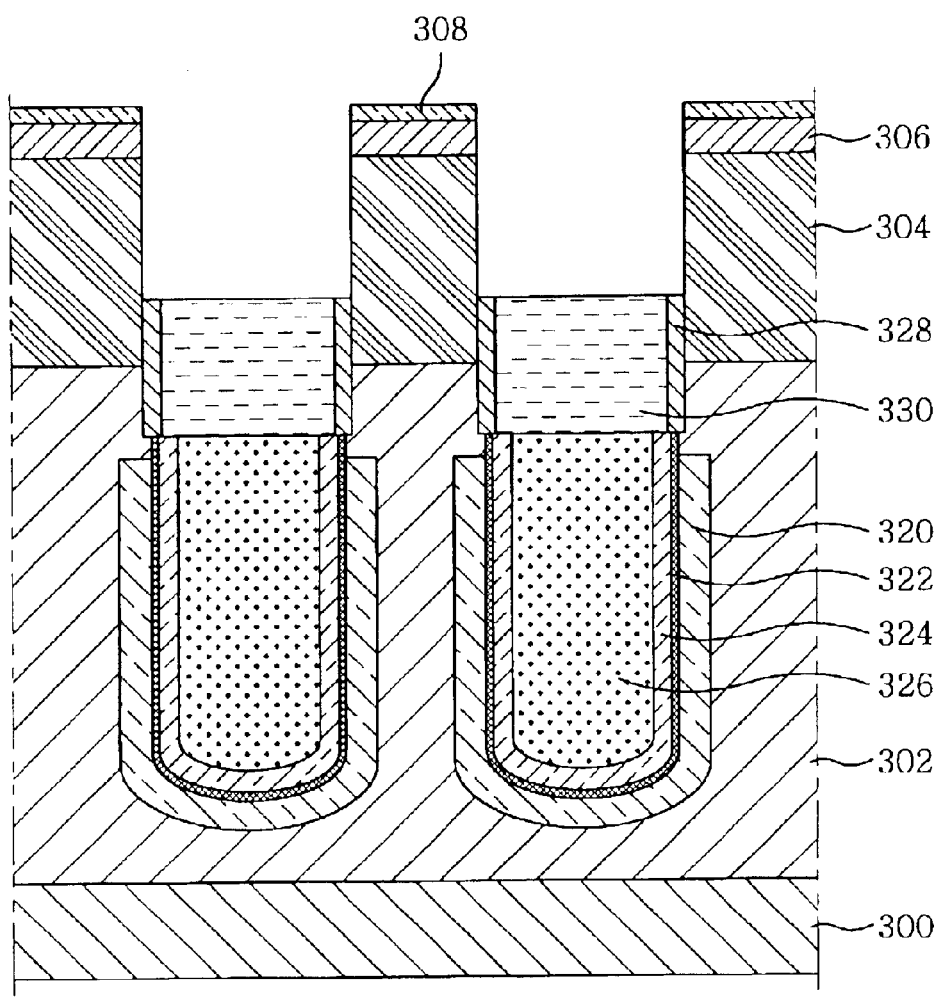

As illustrated in FIG. 3E, a fifth oxide layer 328, having a thickness of about several hundred angstroms, is then formed by thermal oxidation on a trench sidewall. Next, a storage node contact plug 330 is sequentially stacked to thereby fill the trench, and the fifth oxide layer 328 is etched back and then removed by wet etching.

Figure 3F:
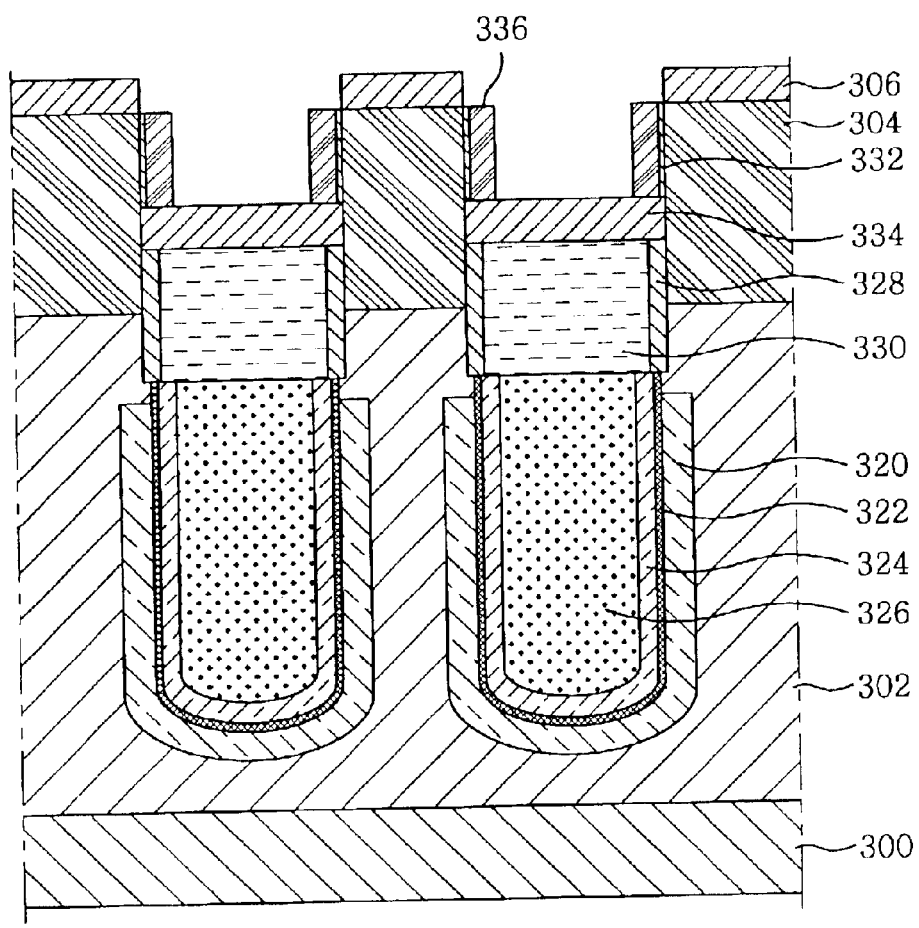

Referring to FIG. 3F, a sixth oxide film 332 is thinly formed by thermal oxidation on the trench sidewall over the storage node contact plug 330. Next, a seventh oxide film 334 is thickly stacked on the storage node contact plug 330, and then etched back to thereby form an insulation layer having a thickness of about several hundred angstroms or more. Next, a mask nitride film 336 is stacked on an inner surface of the sixth oxide layer 332 and then etched back.

Figure 3G:
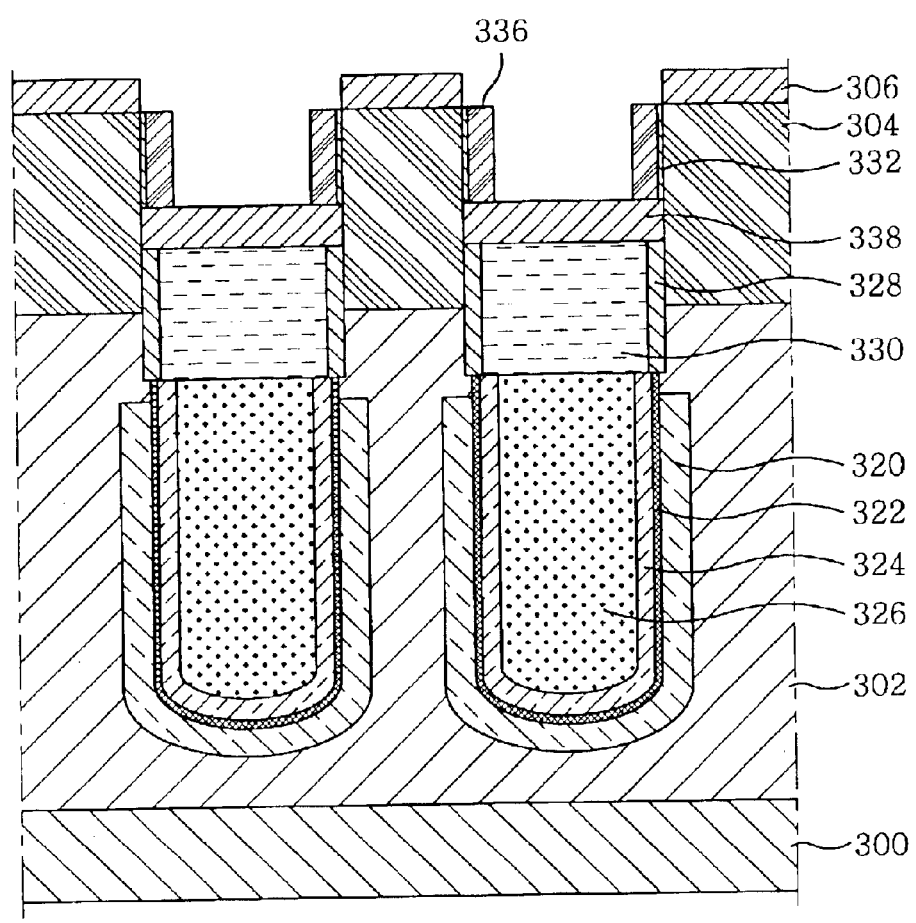

Referring to FIG. 3G, the seventh oxide film 334 is wet-etched. Next, the trench is filled with phosphorous-doped polysilsicon 335 on the storage node contact plug, and then it is etched back to thereby form a poly connector 338.

Figure 3H:
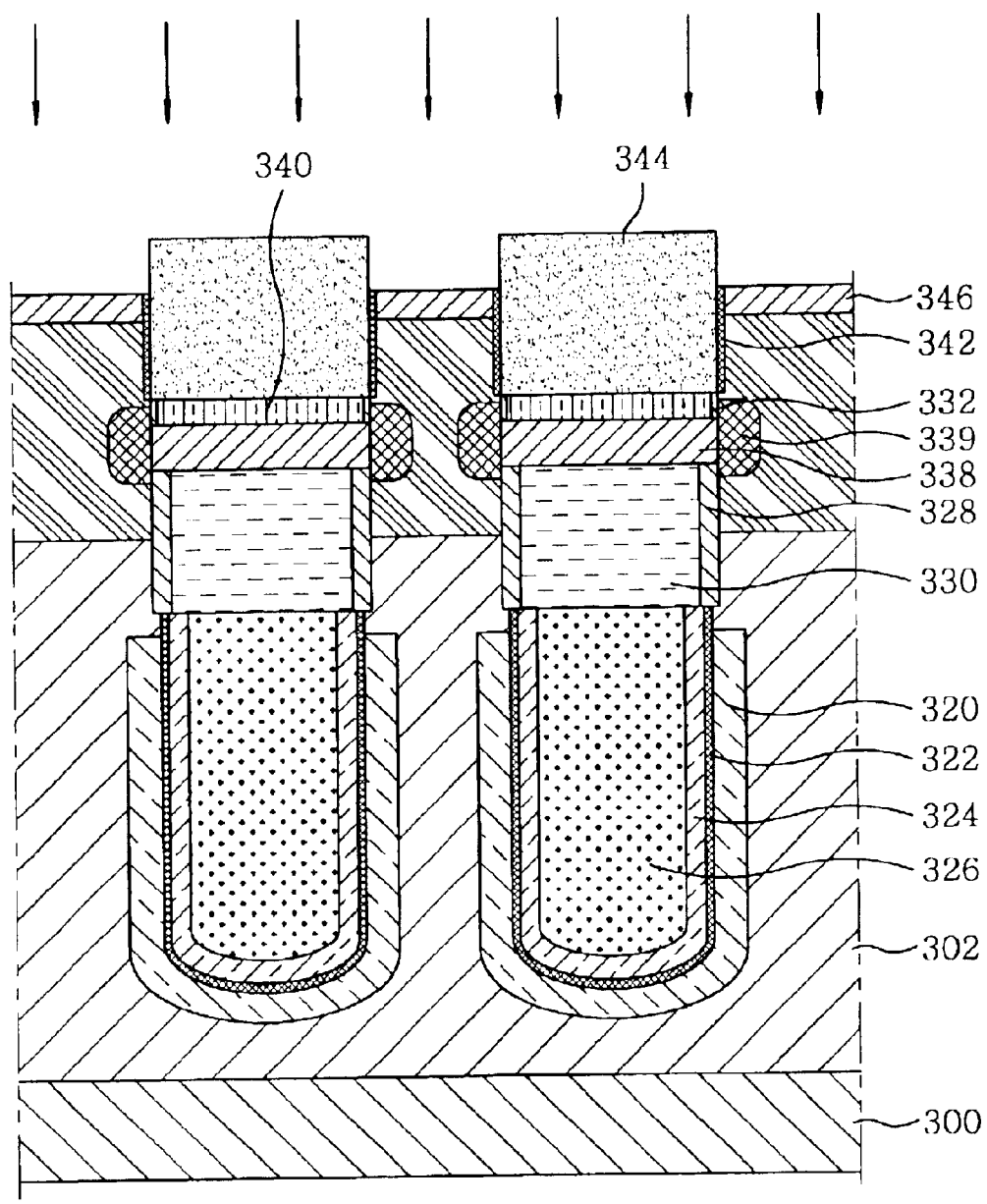
Figure 31:
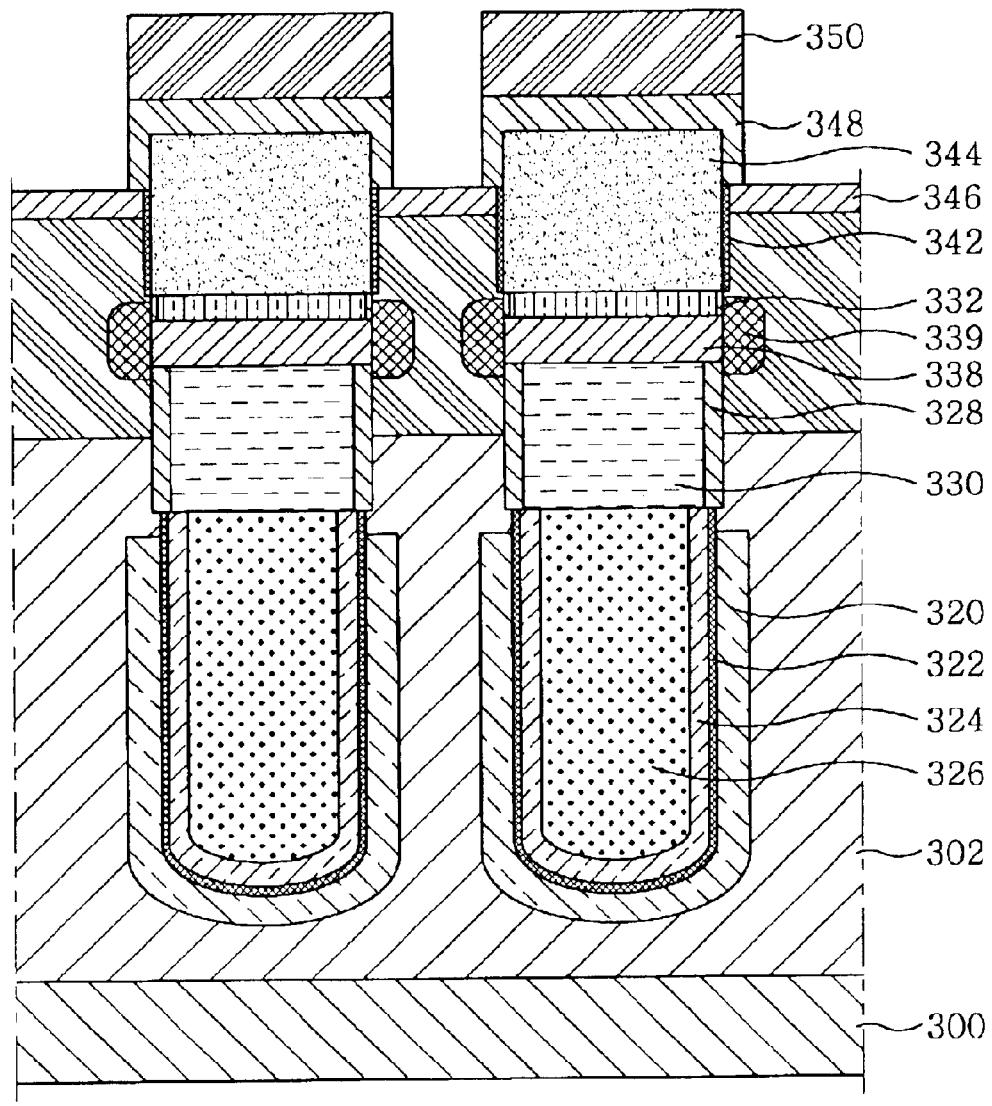

As illustrated in FIG. 3H, the poly connector layer 338 is then annealed so that phosphorous with which the poly connector material, i.e., the polysilicon, is doped diffuses into an adjacent trench sidewall silicon substrate to thereby form a source 339. Next, the mask nitride film 336 is removed by wet etching, and an eighth oxide film 340 is thickly deposited on the poly connector 338 to thereby fill the trench and then etched back. A gate insulation film 342 is then deposited on a trench sidewall over the eighth oxide film 340. And next, the trench over the eighth oxide film 340 is filled with polysilicon to thereby form a gate electrode 344 and an implanting process is performed to thereby form a drain 346 on a surface of the silicon substrate between consecutive gate electrodes. At this step, the gate electrode 344 is formed to protrude on the surface of the silicon substrate Referring to FIG. 3I, a caping nitride film is deposited on the entire silicon substrate, and then patterned to be removed by using a photoresist isolation mask 350 patterned through a photolithography process and an etching process, thereby exposing the drain 346.

Figure 3J:
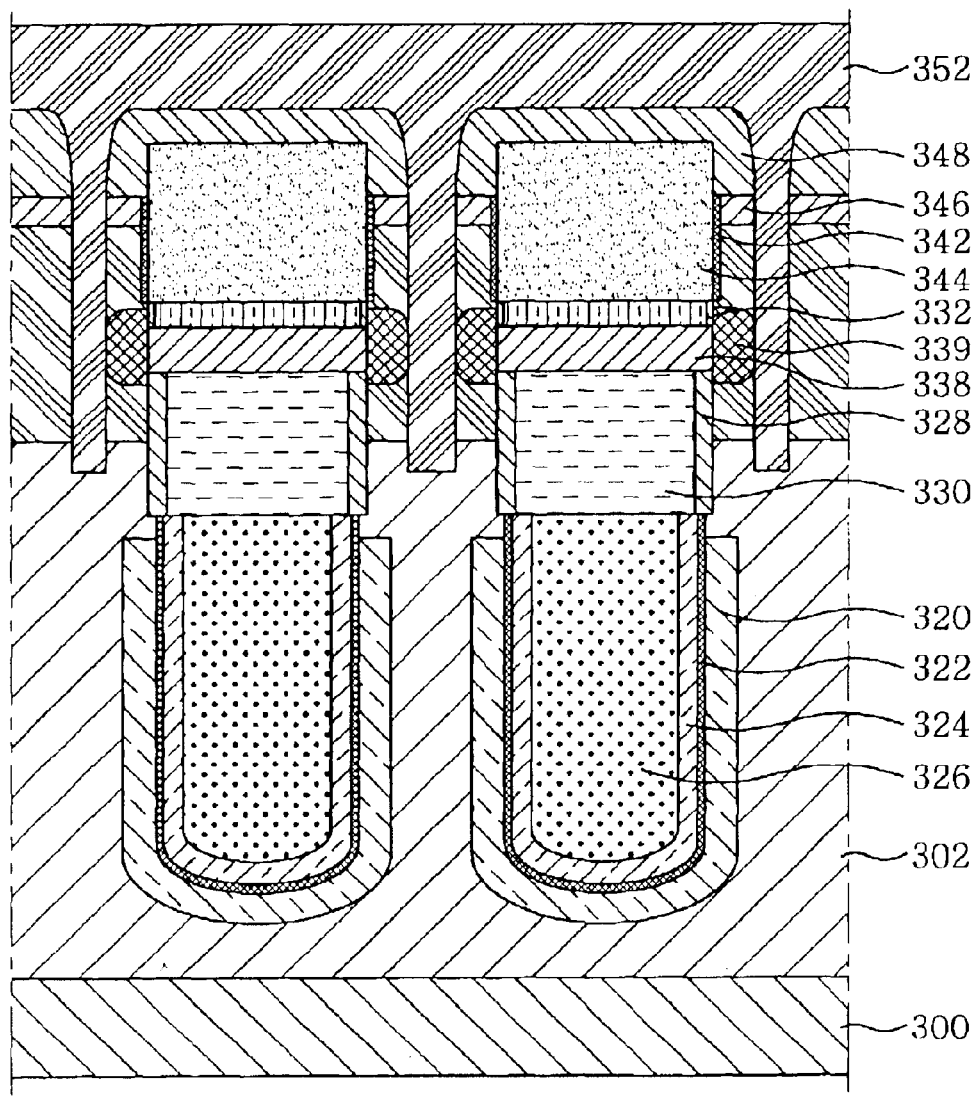

As illustrated in FIG. 3J, the photoresist isolation mask 350 is removed, and then the silicon substrate is dry-etched by a reactive ion etching (RIE) method employing the patterned caping nitride film 348 as a hard mask, to thereby expose the buried n-well region 302. The purpose of this etching process is isolating transistor devices in adjacent trenches from each other. A device isolation hole, being made during this etching process, preferably extends down to the buried n-well region 302. However, it is allowable that it extends down to the self-aligned source 339. Next, a device-isolating planarization oxide film 352 is thickly stacked in the device isolation hole, and then the silicon surface is planarized through a CMP process.

Figure 3K:
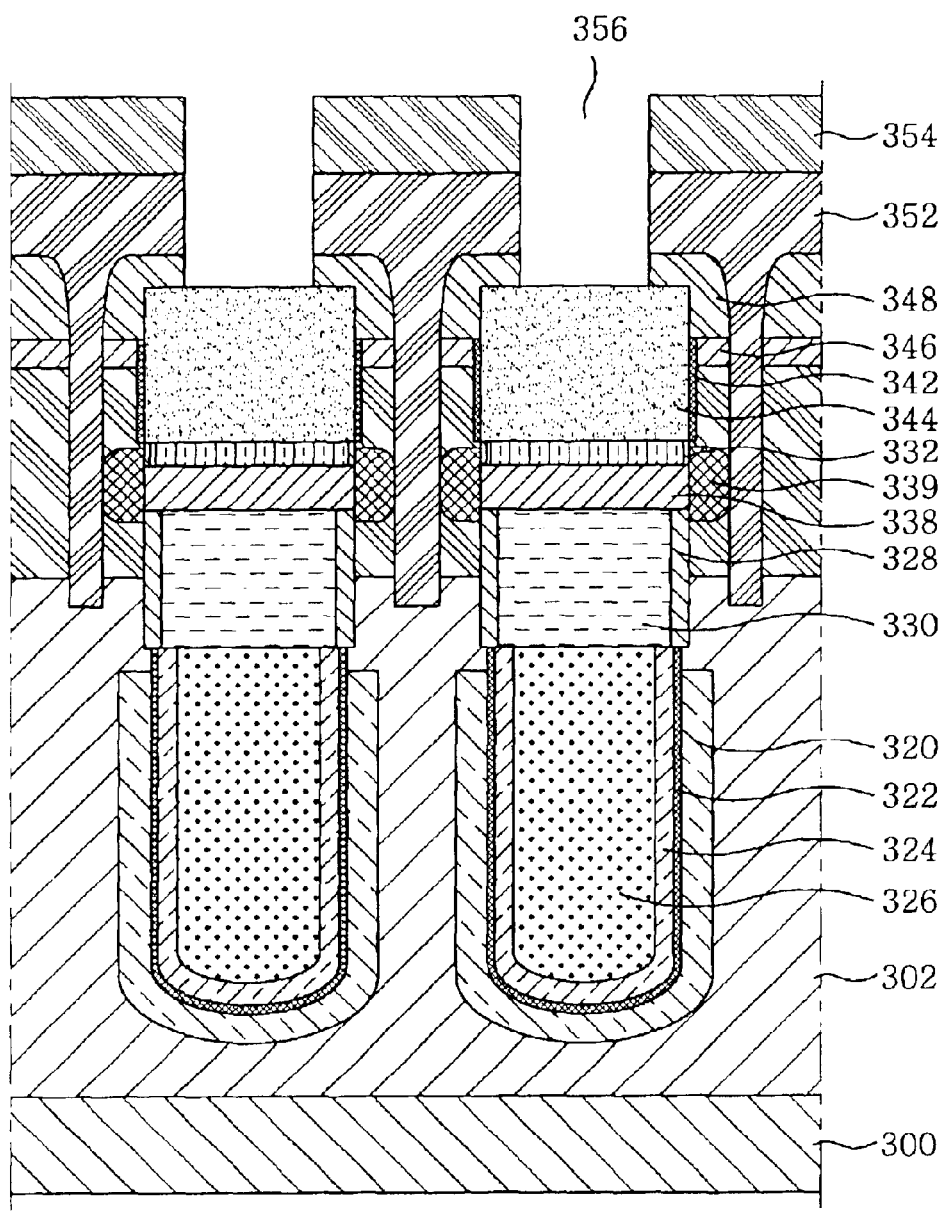

Referring to FIG. 3K, the device-isolating planarization oxide film 352 and the caping nitride film 348 are sequentially dry-etched by using a photoresist word-line mask 354 patterned through a photolithography process and an etching process, to thereby expose the gate electrode 344 so that a word-line contact hole 356 is formed.

Figure 3L:
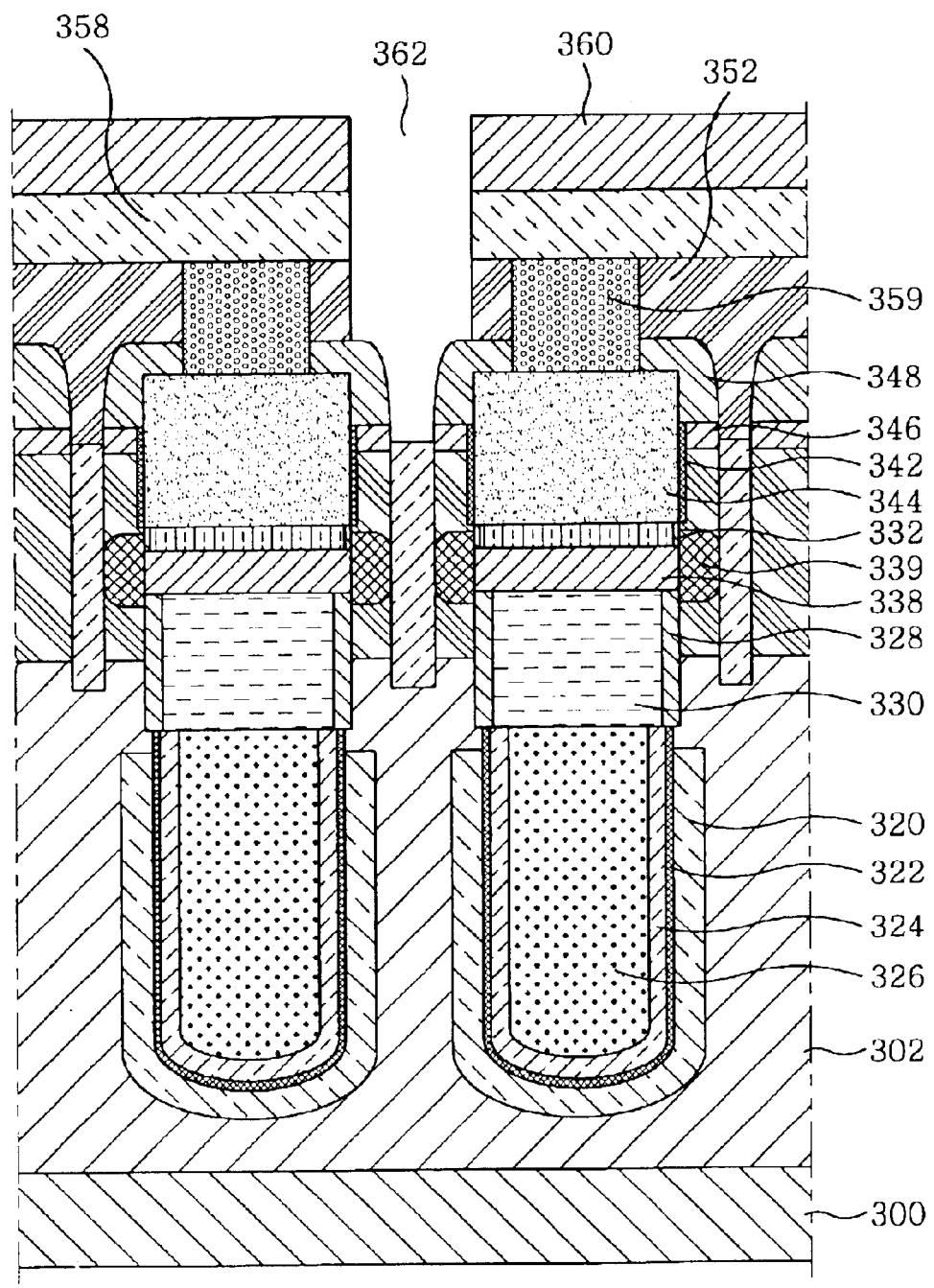

As illustrated in FIG. 3L, the photoresist word-line mask 354 is then removed, and the word-line contact hole 356 is filled with word-line electrode material, e.g., poly, poly electrode or tungsten, a word-line contact 359 is formed through a CMP process, and then a planarization oxide film 358 is deposited on the word-line 359. Next, the planarization oxide film 358 and the device-isolating planarization oxide film 352 are sequentially dry-etched by using a photoresist bit-line contact formation mask 360 patterned through a photolithography process and an etching process, to thereby expose the drain region so that a bit-line contact hole 362 is formed.

Figure 3M:
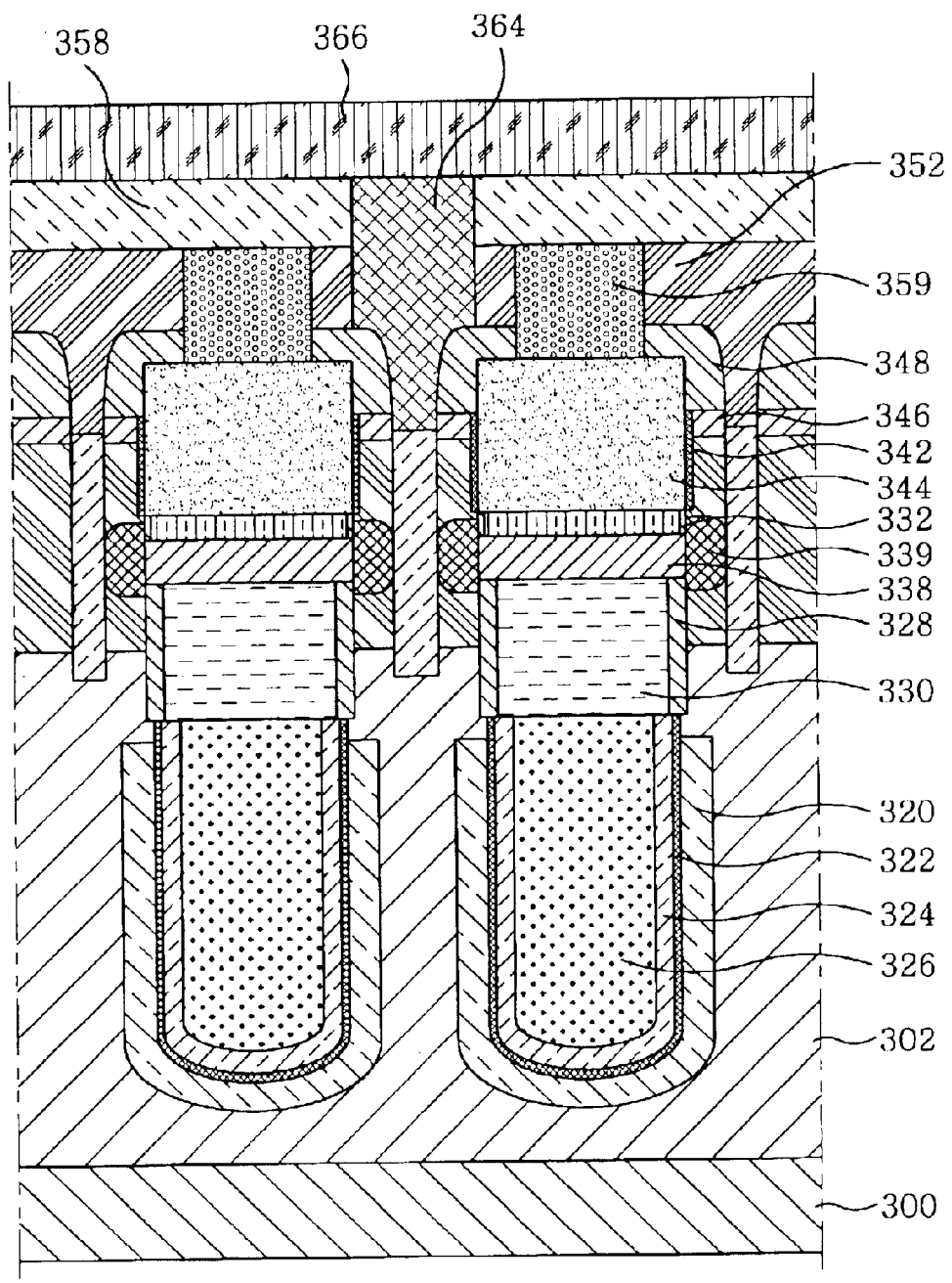

Referring to FIG. 3M, the bit-line contact hole 362 is filled with bit-line electrode material, and then a contact plug 364 is formed by planarization through the CMP process. Next, bit-line electrode material 366 is deposited on the contact plug 364. Then, performing a bit-line masking process, a bit-line is formed vertically to the word-line 359.

While the invention has been shown and described with respect to the preferred embodiments, it will be understood by those skilled in the art that various changes and modifications may be made without departing from the spirit and scope of the invention as defined in the following claims.

In accordance with the present invention, a cylindrical trench is formed in a silicon substrate, and a capacitor and a transistor are formed vertically and cylindrically in the trench, to thereby reduce a restraint of word-line size and length so that a high integration can be achieved.

What is claimed is:

1. A method for fabricating a DRAM cell structure capable of high integration, comprising the steps of:
   (a) forming a trench vertically and cylindrically in a silicon substrate;
   (b) forming a trench-type capacitor having a cylindrical plate electrode and a storage node electrode on a lower region of the trench; and
   (c) forming a vertical cylindrical transistor cell structure connected to the trench-type capacitor on an upper region of the trench,
   wherein the step (b) includes the steps of:
   (b1) forming a plate electrode on a silicon substrate of a lower sidewall of the trench;
   (b2) forming an insulator on the lower sidewall of the trench in which the plate electrode is formed, the insulator being capable of charge accumulation; and
   (b3) forming a storage node electrode on the lower sidewall of the trench on which the insulator is deposited, corresponding to the elate electrode,
   wherein the step (b1) includes the steps of:
   (b11) depositing an LPTEOS layer doped with n-type impurity on the silicon substrate of the lower sidewall of the trench;
   (b12) coating the LPTEOS layer with photoresist, etching back and then removing the exposed LPTEOS layer by wet etching;
   (b13) removing the photoresist film and then depositing an oxide layer thereon; and
   (b14) forming a plate electrode by diffusing the n-type impurity of the LPTEOS layer into the silicon substrate of the lower sidewall of the trench through an annealing process.

2. The method of claim 1, wherein the step (a) includes the steps of:
   (a1) sequentially depositing a first oxide film, a nitride film and a second oxide film on an upper surface of the silicon substrate;
   (a2) depositing a photoresist layer over the second oxide film;
   (a3) forming a trench mask by patterning the photoresist through a photolithography process and an etching process;
   (a4) sequentially etching the second oxide film, the nitride film and the first oxide film by using the patterned trench mask;

(a5) forming a cylindrical trench by etching the second oxide layer at the silicon substrate of trench-forming portion by using an etching hard mask.

3. The method of claim 2, wherein the trench etching in the step (a5) is performed by using a high dry etching selection ratio through a blanket dry etching method to a depth of some micrometers or more.

4. The method of claim 1 further including the step of:
(b15) removing the LPTEOS layer and the oxide film formed on the LPTEOS layer by wet etching.

5. The method of claim 1, wherein the plate electrode is formed in a buried n-well region in the silicon substrate.

6. The method of claim 1, wherein at the step (b2) a capacitor insulation film is formed on the lower sidewall of the trench in which the plate electrode is formed, the capacitor insulation film being capable of charge accumulation.

7. The method of claim 1, wherein at the step (b3) a polysilicon layer doped with n-type impurity is deposited on the insulator formed in the trench, corresponding to the plate electrode.

8. The method of claim 1 further including the steps of:
(b4) filling the trench of the storage node electrode by stacking an oxide film;
(b5) forming a trench-type capacitor by etching back the stacked oxide film to the electrode-forming position, wherein a high dry etching selection ratio of oxide and poly is used.

9. The method of claim 1, wherein the step (c) includes the steps of:
(c1) forming a storage node contact plug over the storage node electrode of the capacitor in the lower trench;
(c2) forming a poly connector over the storage node contact plug, the poly connector connecting the plug and the transistor source;
(c3) forming a source on the silicon substrate of the trench sidewall adjacent to the poly connector, the source being connected to the poly connector;
(c4) forming a gate electrode by being stacked in the trench over the poly connector, the gate electrode being connected to the word-line;
(c5) forming a drain between gate electrodes over the silicon substrate, the drain being connected to the bit-line.

10. The method of claim 9, wherein the step (c1) includes the steps of:
(c11) depositing an oxide film on the trench sidewall over the storage node electrode;
(c12) stacking a contact plug conductor over the storage node electrode in the trench on which the oxide film is formed;
(c13) forming a storage node contact plug by etching back the stacked contact plug.

11. The method of claim 10, wherein the oxide film is formed by thermal oxidation to a depth of about several hundred angstroms or more.

12. The method of claim 10 further including the step of:
(c14) removing the oxide film by wet etching.

13. The method of claim 10, wherein the storage node contact plug is formed in a buried n-well region and a p-well region in the silicon substrate of the trench.

14. The method of claim 9, wherein the step (c2) includes the steps of:
(c21) depositing a first oxide film on the trench sidewall over the storage node contact plug;
(c22) stacking a second oxide film over the contact plug in the trench on which the first oxide film is formed;
(c23) etching back the second oxide film to thereby leave a thickness of the second oxide film about several hundred angstrom;
(c24) depositing a mask nitride film over the surface of the first oxide film formed on the trench sidewall over the second oxide film;
(c25) removing the second oxide film by wet etching, wherein the mask nitride film is used as an etching mask;
(c26) forming a poly connector by stacking n-doped poly silicon or PSG film in the removed second oxide film portion and then etching back, the poly connector being connected to the contact plug.

15. The method of claim 9, the source is formed by diffusing n-type impurity of the poly connector material or p phosphorous in PSG film into the silicon substrate of an adjacent trench sidewall through an annealing process.

16. The method of claim 15, wherein the poly connector material is polysilicon doped with n-type impurity.

17. The method claim 15, wherein the source is formed by being diffused into a p-well region of the silicon substrate in the trench.

18. The method of claim 9, wherein the step (c4) includes the steps of:
(c41) forming an insulation film by thickly stacking a nitride film or an oxide film over the poly connector and then etching back, the insulation film isolating the gate and the connector.
(c42) depositing or thermally growing a gate oxide film on the silicon substrate of the trench sidewall over the insulation film;
(c43) forming a gate electrode by stacking polysilicon in the trench on which the gate oxide film is formed.

19. The method of claim 18, wherein the gate electrode protrudes on a surface of the silicon substrate to a height of about several angstroms.

20. The method of claim 9 further including:
(c6) forming a device isolation film between transistor devices in adjacent trenches;
(c7) connecting the gate electrode to the word-line;
(c8) connecting the drain to the bit-line.

21. The method of claim 20, wherein the step (c6) includes the steps of:
(c61) depositing a caping nitride film on the gate electrode;
(c62) depositing a photoresist layer over the nitride film;
(c63) forming a device isolation mask by patterning the photoresist through a photolithography process and an etching process;
(c64) patterning the nitride film by using the isolation mask;
(c65) etching down to the buried n-well region of the silicon substrate by using the patterned nitride as a hard mask;
(c66) stacking a device isolation oxide film on the etched device isolation hole and planarizing the silicon substrate through CMP process.

22. The method of claim 21, wherein the device isolation hole is formed by RIE dry etching.

23. The method of claim 20, wherein the step (c7) includes the steps of:
(c71) forming a photoresist layer over the device isolation oxide film;

(c72) forming a word-line mask by patterning the photoresist through a photolithography process and an etching process;

(c73) forming a word-line contact hole by sequentially etching the device isolation film and the caping nitride film, using the word-line mask;

(c74) forming a word-line connected to the gate electrode by stacking a word-line electrode material in the word-line contact hole, and then planarizing through a CMP process.

24. The method of claim 20, wherein the step (c8) includes the steps of:

(c81) depositing a planarization oxide film over the word-line;

(c82) forming a photoresist layer over the planarization oxide film;

(c83) forming a bit-line contact formation mask by patterning the photoresist through a photolithography process and an etching process;

(c84) forming a bit-line contact hole by sequentially etching the planarization oxide film and the device isolation planarization oxide film down to the drain region, using the bit-line contact mask;

(c85) forming a bit-line contact plug by filling the bit-line contact hole with bit-line electrode material, and then planarizing through a CMP process;

(c86) forming a bit-line vertical to the word-line over the bit-line contact plug by bit-line masking.

25. The method of claim 24, wherein the bit-line connects drains of two transistor devices in adjacent trenches.

* * * * *